(12) United States Patent
Chen

(10) Patent No.: US 9,685,569 B2
(45) Date of Patent: Jun. 20, 2017

(54) METHOD OF CIGS ABSORBER FORMATION

(71) Applicant: TSMC Solar Ltd., Taichung (TW)

(72) Inventor: Shih-Wei Chen, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 309 days.

(21) Appl. No.: 14/203,722

(22) Filed: Mar. 11, 2014

(65) Prior Publication Data

US 2015/0263198 A1 Sep. 17, 2015

(51) Int. Cl.
*B05D 5/12* (2006.01)
*H01L 31/032* (2006.01)
*H01L 31/0224* (2006.01)

(52) U.S. Cl.
CPC .. *H01L 31/0322* (2013.01); *H01L 31/022466* (2013.01); *Y02P 70/521* (2015.11)

(58) Field of Classification Search
CPC combination set(s) only.
See application file for complete search history.

(56) References Cited

U.S. PATENT DOCUMENTS

| | | | | |
|---|---|---|---|---|
| 2011/0073688 A1* | 3/2011 | Yang | | B02C 17/10 241/15 |
| 2012/0080091 A1* | 4/2012 | Min | | C09D 11/037 136/262 |
| 2013/0040420 A1* | 2/2013 | Bollman | | C23C 14/12 438/95 |
| 2013/0048074 A1* | 2/2013 | Cho | | H01L 31/0322 136/262 |
| 2013/0217177 A1* | 8/2013 | Wong | | C23C 16/306 438/95 |
| 2013/0276888 A1* | 10/2013 | Munteanu | | H01L 31/0322 136/264 |

FOREIGN PATENT DOCUMENTS

CN 102074592 A 5/2011

OTHER PUBLICATIONS

Official Action issued Jun. 2, 2016 in counterpart Chinese patent application No. 2016053000795800.

* cited by examiner

*Primary Examiner* — Austin Murata
(74) *Attorney, Agent, or Firm* — Duane Morris LLP

(57) ABSTRACT

A method of forming a CIGS absorber wherein at least one source particle is selected and prepared as a powder or gel; the powder or gel is deposited on a substrate, compressed, and annealed. In some embodiments, a plurality of source particles are prepared as powders and mixed prior to deposition, compression, and annealing. In other embodiments, a plurality of source particles are individually deposited in layers, collectively compressed, and collectively annealed. In yet further embodiments, a plurality of source particles are individually deposited in layers, individually compressed, and collectively annealed.

19 Claims, 9 Drawing Sheets

2

METHOD OF CIGS ABSORBER FORMATION

BACKGROUND

This disclosure relates to fabrication of thin film photovoltaic cells.

Thin film solar cells, also known as thin film photovoltaic cells, are used to convert light energy directly into electrical energy. The manufacture of thin film solar cells includes the steps of sequentially depositing one or more thin film layers onto a substrate. A thin film solar cell usually includes a bottom layer, a back electrode layer, an absorber layer, a buffer layer, and front contact layer. Many thin film solar cells use a "CIGS-based" absorber in the absorber layer, where "CIGS" generally refers to Copper-Indium-Gallium-Selenide or $Cu(In,Ga)Se_2$.

CIGS materials are typically prepared in solution by dissolving the constituent compounds such as $In_2Se_3$, $Cu_2S$, $Ga_2(SO_4)_2$, $SeO_2$, $CuCl_2 \cdot 2H_2O$, and $InCl_3 \cdot nH_2O$ in solvents such as hydrazine, ethylene glycol, dismethylsulfoxide, and dimethyformamide. In some circumstances, treatment with heat and acids such as HCl are used to initiate compound dissolution in the solvent. These solutions are then usually mixed, spin-coated onto the substrate or back electrode layer, and crystallized. In some circumstances, the precipitates of such solutions are filtered, washed, and dried for later deposition onto the substrate or back electrode layer. This solution-based process has the advantages of high throughput during CIGS manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
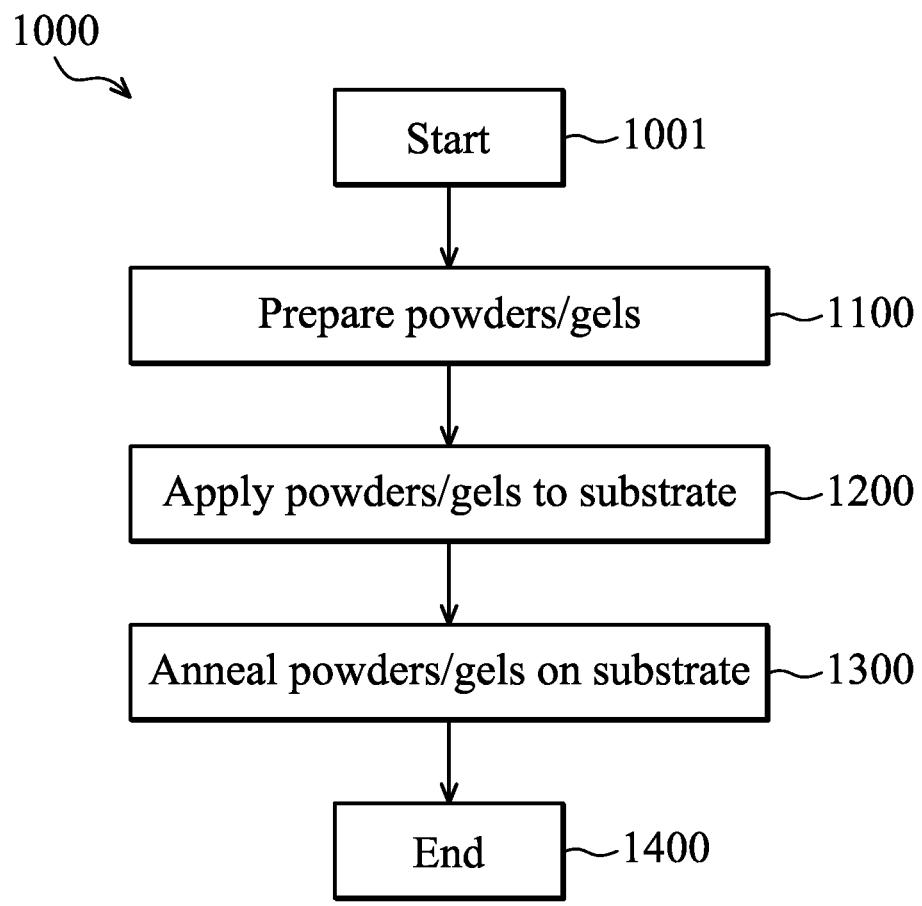
FIG. 1 is a flow chart of the method of forming a CIGS absorber layer in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method of forming a CIGS absorber layer through solid sintering. In some embodiments, the method comprises three steps: (1) preparing a powder or gel, (2) applying the powder or gel to a substrate, and (3) performing an annealing process. The use of solid sintering during CIGS absorber formation allows a manufacturer to avoid using toxic materials—such as the toxic solvents required in the solutions-based method—during the formation of CIGS absorbers.

Throughout this disclosure "CIGS" generally refers to Copper-Indium-Gallium-Selenide or $Cu(In,Ga)Se_2$, which may also be represented as $Cu(In_xGa_y)Se_2$.

Throughout this disclosure the words "powder" and "gel" are used in combination (i.e. "powder and/or gel") to indicate that the material discussed could be in either a powder or gel state during that step of the disclosed method. The words "powder" and "gel" are used alone when only a material in that state is being discussed during that step of the disclosed method.

Figure 4A:
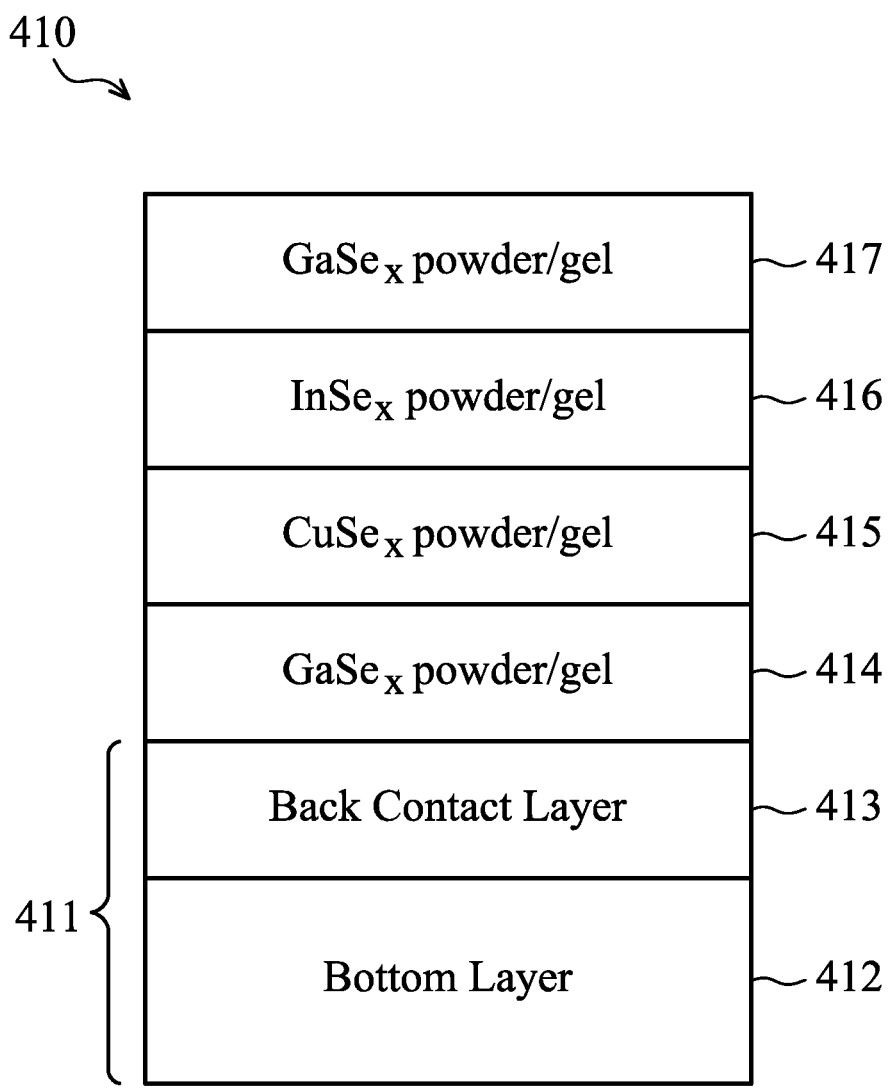
FIG. 4A is a simplified block diagram of a powder and/or gel stack, in accordance with some embodiments.

FIG. 4A is a simplified cross-section of a powder and/or gel stack 410 containing CIGS precursors for forming an absorber layer 706 in accordance with some embodiments. In this discussion of absorber layer 706 formation, the term "substrate" refers to the layers 411 underneath the absorber. Thus, the substrate 411 includes a bottom layer 412 and a back contact layer 413. The bottom layer 412 comprises a substrate material, such as glass. In some embodiments, bottom layer 412 includes soda lime glass, or a flexible metal foil or polymer (e.g., a polyimide, polyethylene terephthalate (PET), or polyethylene naphthalene (PEN)).

In some embodiments, the back contact layer 413 includes any suitable back contact material, such as metal. In some embodiments, back contact layer 413 can include molybdenum (Mo), platinum (Pt), gold (Au), silver (Ag), nickel (Ni), or copper (Cu). Other embodiments include still other back contact materials. In some embodiments, the back contact layer 413 is from about 50 nm to about 2 µm thick.

A plurality of powders and/or gels providing absorber material precursors are sequentially applied to the solar cell substrate 411 to form a powder and/or gel stack 410. In some embodiments, the absorber is a CIGS material, and the absorber precursors include layers of powder and/or gel. In some embodiments, the absorber precursors are CIGS precursors including: $GaSe_x$ 414, $CuSe_x$ 415, $InSe_x$ 416, and $GaSe_x$ 417.

Figure 4B:
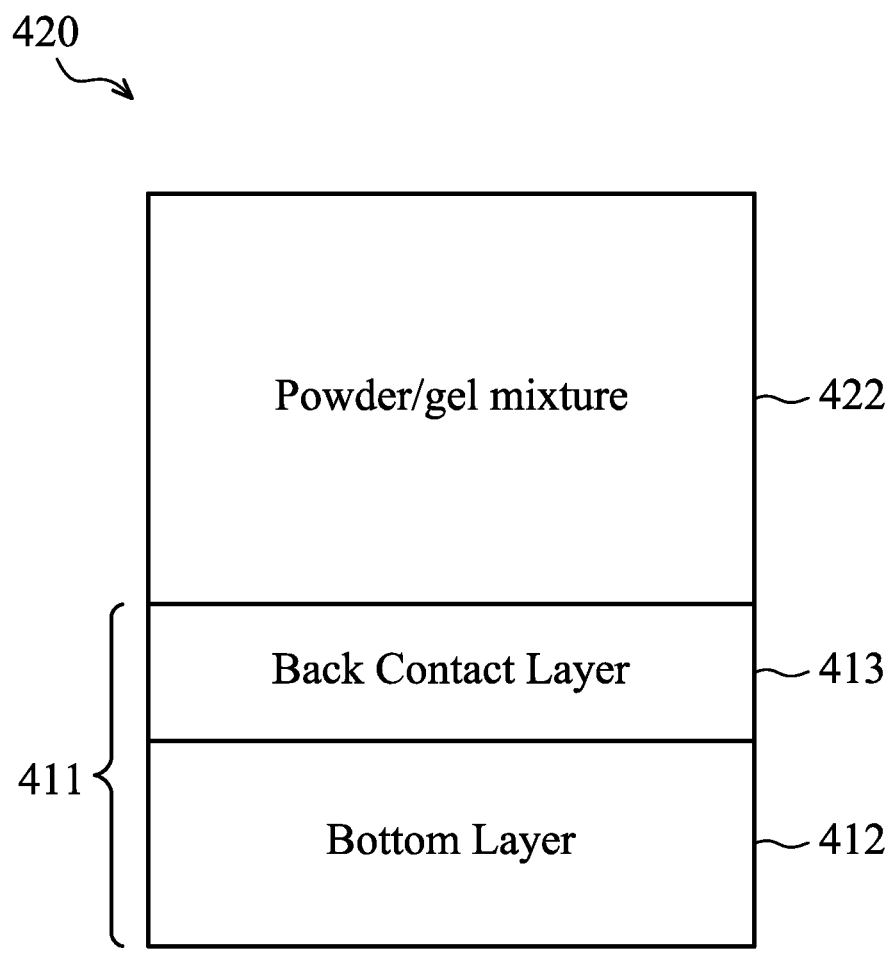
FIG. 4B is a simplified block diagram of a mixed stack, in accordance with some embodiments

FIG. 4B is a simplified cross section of a mixed stack 420 in accordance with some embodiments. In some embodiments, a plurality of powders and/or gels providing absorber material precursors are mixed together and applied to the solar cell substrate 411 to form a mixed stack 420.

FIG. 1 is a flow chart of the method 1000 of forming a CIGS absorber layer 706 in accordance with some embodiments. Each step of the method 1000 illustrated in FIG. 1 is described in greater detail below. The method 1000 begins at block 1001. At block 1100 the desired powders and/or gels are prepared. At block 1200 the powders and/or gels are applied to a solar cell substrate. In some embodiments, gels are formed directly on the back contact layer 413 of the solar cell. In other embodiments, gels are formed separately over a polymer or stainless steel transfer substrate (not shown), and then transferred to the solar cell substrate 411. At block 1300, the powders and/or gels are annealed on a solar cell substrate 411. The method 1000 ends at block 1400.

Figure 2:
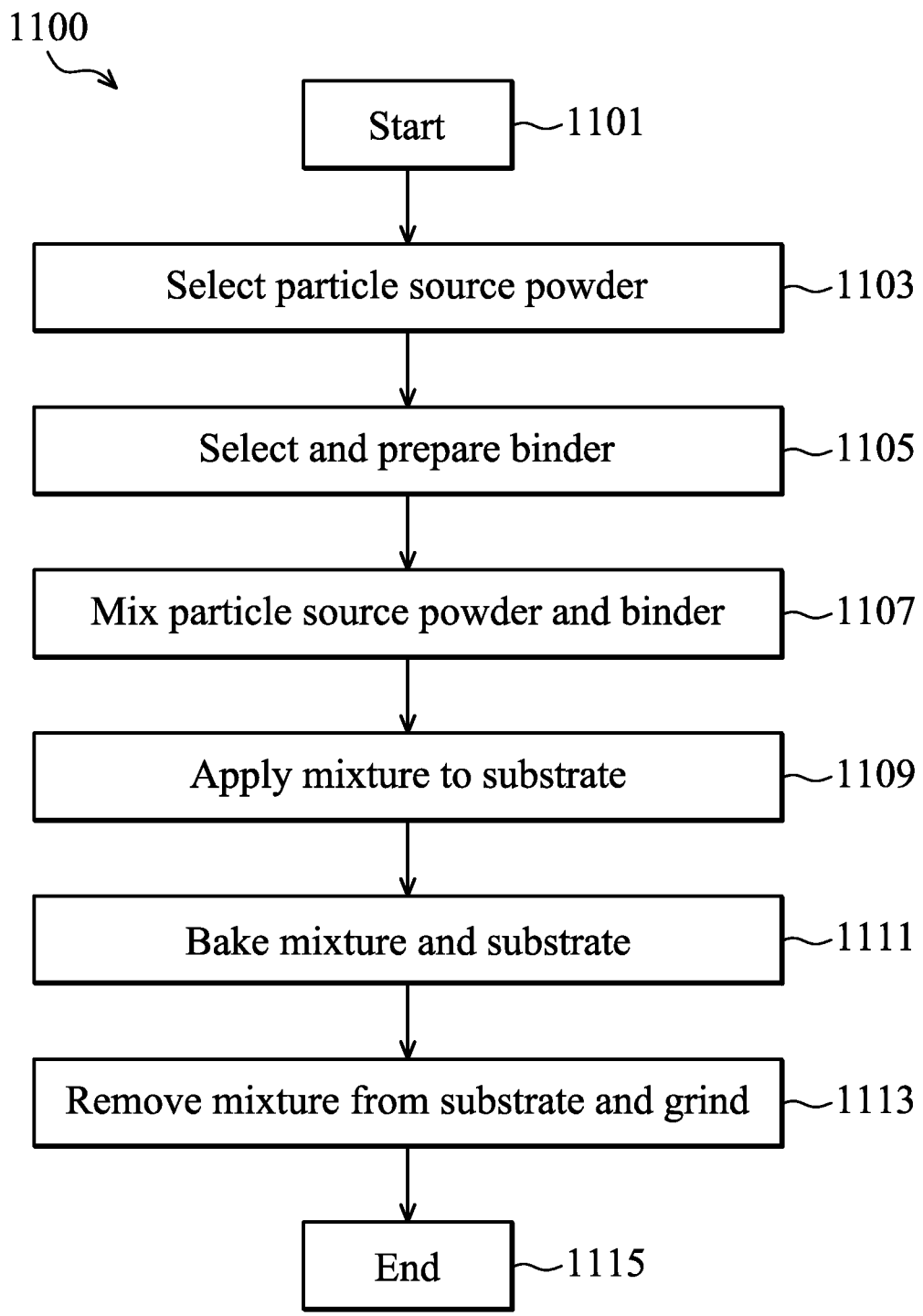
FIG. 2 is a flow chart of a method of preparing the desired powders and/or gels, in accordance with some embodiments.

FIG. 2 is a flow chart of a method 1100 of preparing the desired powders and/or gels in accordance with some embodiments. The method 1100 begins at block 1101. At block 1103, a source particle powder is selected. CIGS absorbers are formed using a variety of constituent source particles which are selected to produce a final absorber layer comprising $Cu(In_xGa_y)Se_2$. Constituent source particles are selected for use based on numerous factors including the Se-to-metal ratio. Constituent source particles with a higher Se-to-metal ratio require less selenium during the selenization process. Table 1 below provides a list of appropriate compounds for selection based on the desired constituent compound to be used in forming a CIGS absorber layer.

TABLE 1

Source particle Selection

| Constituent Compound | Source particle |
|---|---|
| $InSe_x$ | $In_4Se_3$, InSe, $In_2Se_3$ |
| $CuSe_x$ | $CuSe_2$, CuSe, $Cu_3Se_2$, $Cu_{2-x}Se$ |
| $GaSe_x$ | $Ga_4Se_3$, GaSe |
| $CuInSe_x$ | $CuInSe_x$ or mix $CuSe_x$ and $InSe_x$ |
| $CuGaSe_x$ | $CuGaSe_x$ or mix $CuSe_x$ and $GaSe_x$ |
| $InGaSe_x$ | $InGaSe_x$ or mix $InSe_x$ and $GaSe_x$ |

At block 1105, a binder is selected and prepared by dissolving a polymer in a solvent. Table 2 below provides the appropriate solvent to be used with each of the common polymers used to form binders. The constituent source particles listed in Table 1 above are selected for mixing with the binder created from Table 2 below based on observed wetting behavior when combining constituent source particles and the binder.

TABLE 2

| Polymer and Solvent Combinations | |
|---|---|
| Polymer | Solvent |
| Polyvinyl Alcohol (PVA) | Water |
| Polyvinyl Butyral (PVB) | Alcohol |
| Polyacrylic Acid (PAA) | Alcohol or Water |
| Polymer Methacrylic Acid | Water |
| Ammonium Polymethacrylate | Water |

TABLE 2-continued

| Polymer and Solvent Combinations | |
|---|---|
| Polymer | Solvent |
| Polymer Methyl Methacrylic Acid (PMAA) | Ethanol or Isopropanol |

At block 1107, the source particle powder and binder are mixed. In some embodiments, the binder/powder volume percentage is between 0.5% and 5%. Higher binder/powder volume percentages provide more flexible gel but can cause more severe shrinking during the annealing process.

At block 1109 the mixture of source particle powder and binder is applied to a transfer substrate. In some embodiments, the transfer substrate is formed from stainless steel, $ZrO_2$, $Al_2O_3$, polymer such as PET, or similar material. The mixture and transfer substrate are baked at block 1111. In some embodiments, the mixture and transfer substrate are baked by placing them within an oven which is heated between 80 and 100° C. The baking process removes the solvent from the mixture.

At block 1113, the mixture and transfer substrate are removed from the oven, the mixture is removed from the transfer substrate, and the mixture is mechanically ground to a predetermined grain size. In some embodiments, the final grain size following mechanical grinding is between 1 nm and 100 μm. The method 1100 ends at block 1115. At the conclusion of method 1100, the mechanically ground mixture is in a powder or gel state.

Figure 3A:
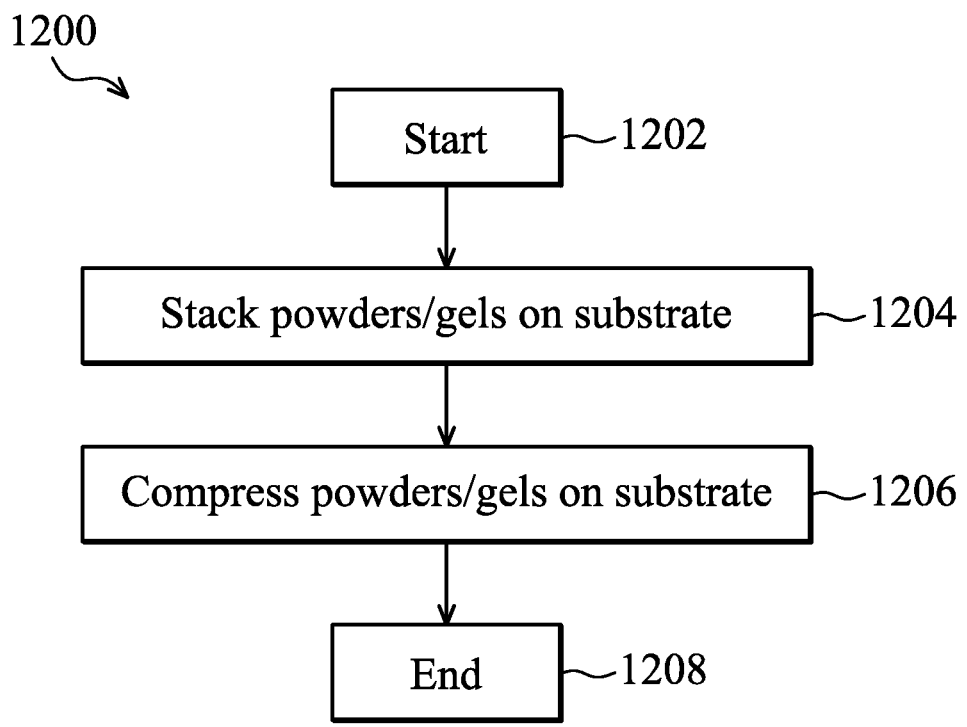
FIG. 3A is a flow chart of a method of applying powers and/or gels to a back contact layer of a solar cell substrate in accordance with some embodiments.

FIG. 3A is a flow chart of a method 1200 of applying the powders and/or gels which resulted from method 1100 over the back contact layer 413 of a solar cell substrate 411 in accordance with some embodiments. Method 1200 starts at block 1202. Powders and/or gels are sequentially applied to the solar cell substrate 411 to create a powder and/or gel stack 410 at block 1204 and compressed on the solar cell substrate 411 at block 1206. In some embodiments, the compression at block 1206 is performed at a pressure of about 50 Pa and at a temperature of about 25° C. In some embodiments, the compression at block 1206 is performed at a pressure of between 10 Pa and 100 MPa, and at a temperature between 25 and 50° C. Method 1200 ends at block 1208.

Figure 3B:
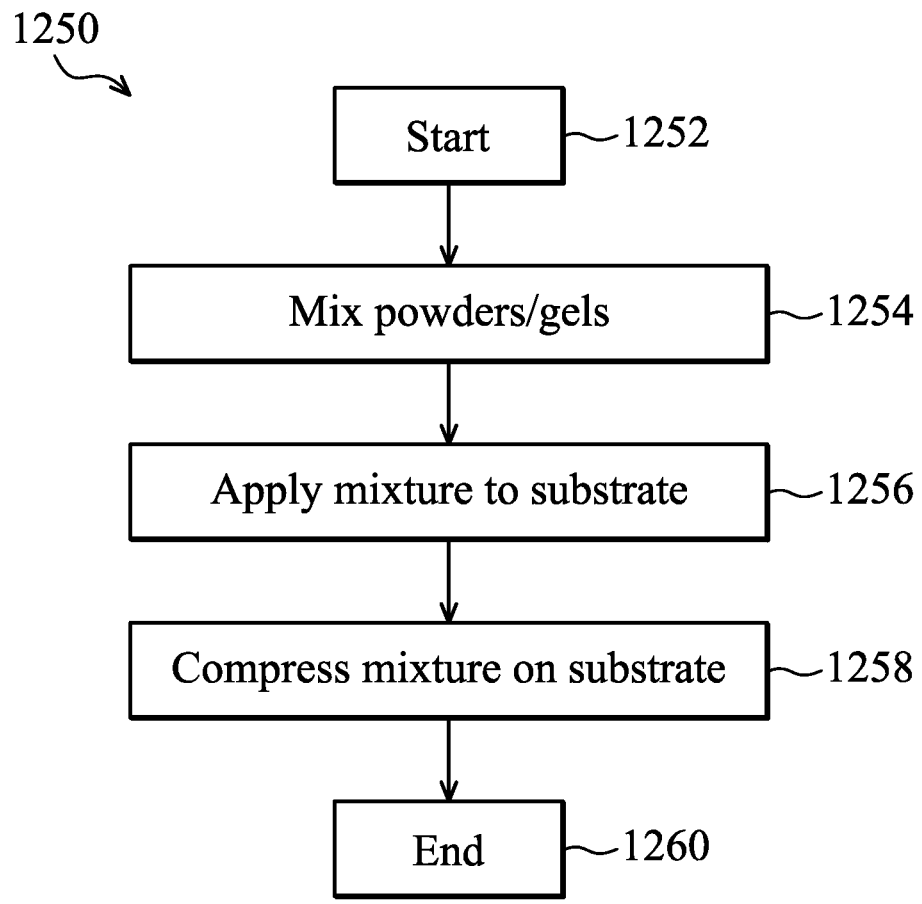
FIG. 3B is a flow chart of a method of applying powers and/or gels to a back contact layer of a solar cell substrate in accordance with some embodiments.

As an alternative to method 1200, FIG. 3B is a flow chart of a method 1250 of applying the powders and/or gels which resulted from method 1100 over the back contact 413 of a solar cell substrate 411 in accordance with some embodiments. Method 1250 starts at block 1252. Powders and/or gels are mixed at block 1254, applied to a solar cell substrate 411 at block 1256, and compressed on the solar cell substrate 411 at block 1258. Method 1250 ends at block 1260.

At the conclusion of either method 1200 or method 1250, a compressed powder and/or gel stack is disposed on a back contact layer 413.

In some embodiments, powders and/or gels, alone or mixed, are applied to the back contact layer 413 of the solar cell substrate 411 mechanically. In some embodiments, powders and/or gels, alone or mixed, are compressed on the solar cell substrate 411 by a roll-bonding process.

FIG. 4A shows a powder and/or gel stack 410 in accordance with some embodiments. At block 1204 of FIG. 3A, the desired powders and/or gels are sequentially applied to a solar cell substrate 411 to form a powder and/or gel stack 410. In some embodiments, the layers of powder and/or gel are sequentially applied as follows: $GaSe_x$ 414, $CuSe_x$ 415, $InSe_x$ 416, and $GaSe_x$ 417.

In some embodiments, the layers illustrated in FIG. 4A are formed individually. For example, a layer 414 of $GaSe_x$ powder or gel is first applied to a transfer substrate (not shown) and compressed. This layer 414 is then removed from the transfer substrate and disposed on the back contact layer 413 of a solar cell substrate 411. Additional layers of $CuSe_x$ 415, $InSe_x$ 416, and $GaSe_x$ 417 are then individually applied and compressed on a transfer substrate, removed from the transfer substrate, and disposed above the $GaSe_x$ 414 layer on the back contact layer 413 of the solar cell substrate 411. Once each of the desired layers 414-417 is disposed on the solar cell substrate 411 an additional compression can be performed to ensure proper adhesion of the layers.

In other embodiments, the layers illustrated in FIG. 4A are formed over a separate transfer substrate (not shown) and compressed collectively. For example, a layer 414 of $GaSe_x$ powder or gel is applied to a transfer or solar cell substrate 411. Additional layers of $CuSe_x$ 415, $InSe_x$ 416, and $GaSe_x$ 417 powders and/or gels are then applied, and all layers 414-417 are then compressed at the same time. In those embodiments where all layers are compressed on a transfer substrate, the compressed layers are then removed from the transfer substrate and disposed on a back contact layer 413 of a solar cell substrate 411.

FIG. 4B shows a mixed stack 420 in accordance with some embodiments. At block 1254 of FIG. 3B, a pre-mixed mixture of powders and/or gels 422 is applied to a solar cell substrate 411, comprising bottom layer 412 and back contact layer 413, to form a mixed stack 422. At block 1258, this mixed stack 422 is compressed as described above.

Figure 5:
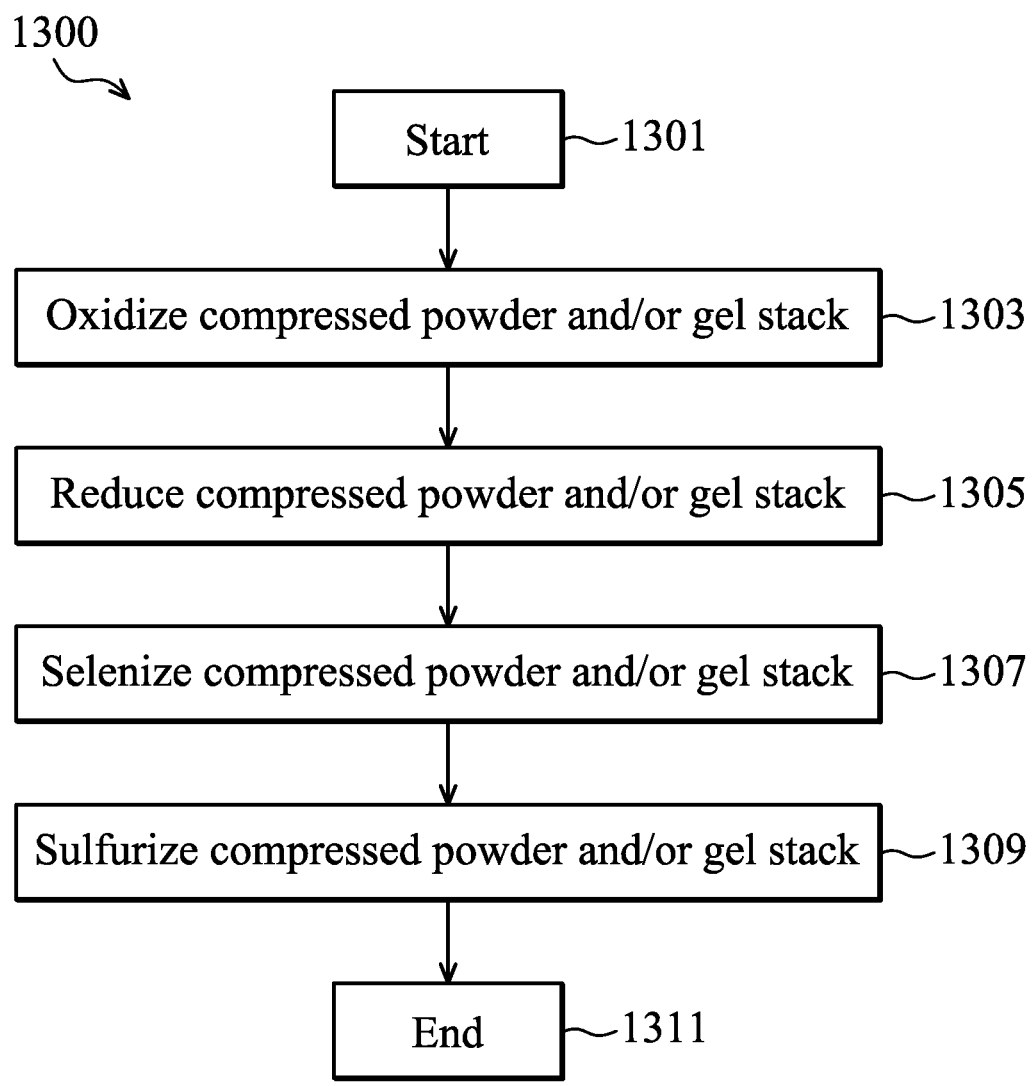
FIG. 5 is a flow chart of a method of annealing a compressed powder and/or gel stack, in accordance with some embodiments.

FIG. 5 is a flow chart of a method 1300 of annealing the compressed powder and/or gel stack 410 or mixed stack 420 disposed on a solar cell substrate 411 in accordance with some embodiments. The method 1300 starts at block 1301. At block 1303 the compressed powder and/or gel stack 410 or mixed stack 420 is oxidized. In some embodiments, thermal oxidation is performed at temperatures between 250 and 450° C. Thermal oxidation of the compressed powder and/or gel stack 410 or mixed stack 420 causes the polymer binder to decompose into CO, $CO_2$, or $H_2O$ gas.

At block 1305 the compressed powder and/or gel stack 410 or mixed stack 420 is reduced with a forming gas. In some embodiments, the forming gas is a mixture of $H_2$ and Ar. In some embodiments, reduction is performed at temperatures between 200 and 550° C. Following the oxidation performed at block 1303, oxygen will incorporate into the compressed powder and/or gel stack 410 or mixed stack 420 and replace some Se which was bonded with Cu, In, and Ga. The reduction of block 1305 removes this oxygen.

In some embodiments, at block 1307 the compressed powder and/or gel stack 410 or mixed stack 420 is selenized. In some embodiments, selenization is performed using Se vapor or $H_2Se$. In some embodiments, selenization is performed at temperatures between 500 and 600° C. The selenization performed at block 1307 replaces Se which was previously displaced by oxidation and reduction.

In some embodiments, at block 1309 the compressed powder and/or gel stack 410 or mixed stack 420 is sulfurized. In some embodiments, sulfurization is performed at temperatures between 500 and 600° C.

It is important to note that blocks 1307 and 1309 represent optional steps of method 1300. A compressed powder and/or gel stack 410 or mixed stack 420 can be selenized, sulfurized, or both selenized and sulfurized.

Method 1300 ends at block 1311. At the conclusion of method 1300, a CIGS absorber layer 706 is disposed on a solar cell substrate 411.

Figure 6:
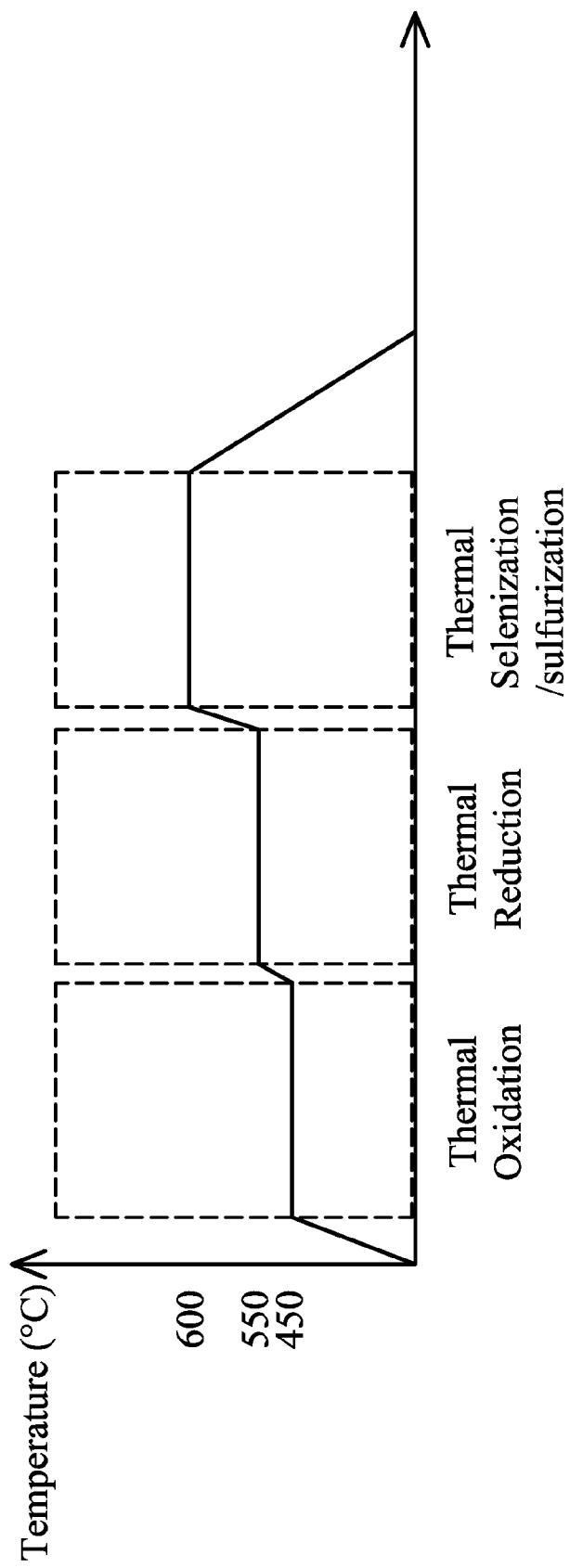
FIG. 6 is a graph showing a temperature profile an annealing process, in accordance with some embodiments

FIG. 6 is a graph showing a temperature profile during method 1300, described above with reference to FIG. 5, in accordance with some embodiments. As disclosed above, in some embodiments the compressed powder and/or gel stack 410 or mixed stack 420 is oxidized at a temperature of approximately 450° C. or less, reduced at a temperature of approximately 550° C. or less, and selenized and/or sulfurized at a temperature of approximately 600° C. or less.

Figure 7:
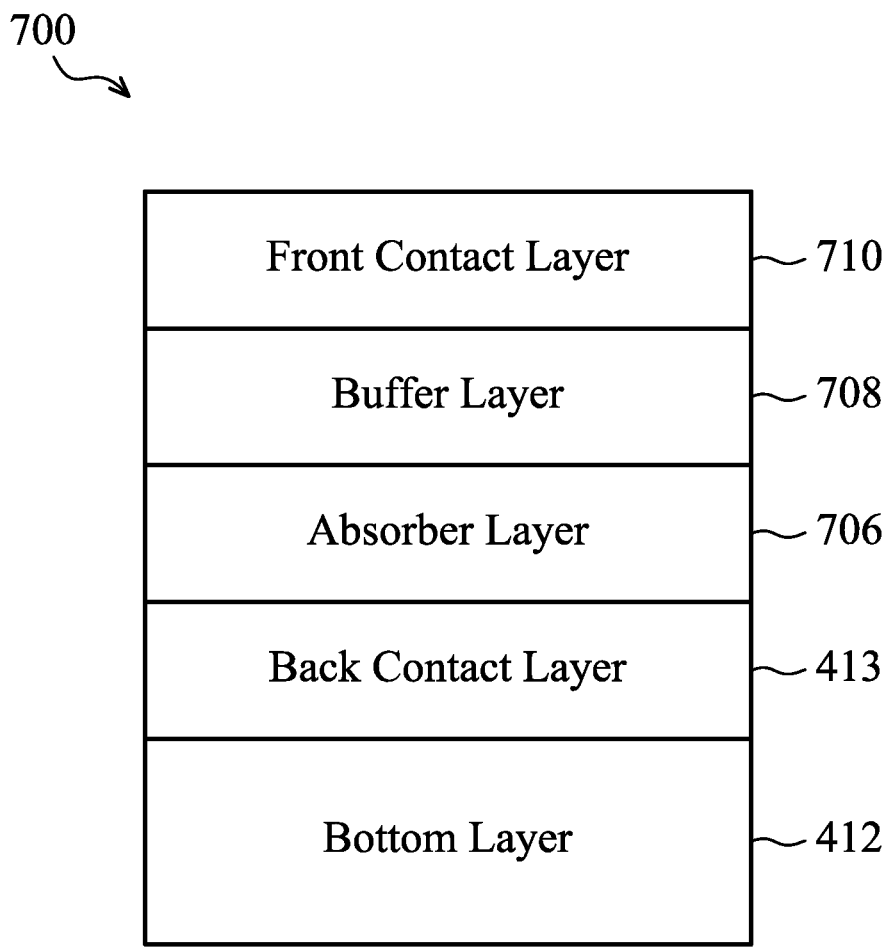
FIG. 7 is a simplified block diagram of a thin film solar cell in accordance with some embodiments.

FIG. 7 is a simplified block diagram of a thin film solar cell in accordance with some embodiments. Following completion of the absorber layer 706 using the methods disclosed above, the buffer layer 708 is formed, the P2 scribe line is scribed, front contact layer 710 is formed and the P3 scribe line is scribed. The buffer layer 708 includes any suitable buffer material, such as n-type semiconductors. In some embodiments, the buffer layer 708 can include cadmium sulphide (CdS), zinc sulphide (ZnS), zinc selenide (ZnSe), indium(III) sulfide ($In_2S_3$), indium selenide ($In_2Se_3$), or $Zn_{1-x}Mg_xO$, (e.g., ZnO). Other embodiments include still other buffer materials. In some embodiments, the buffer layer 708 is from about 1 nm to about 500 nm thick.

In some embodiments, the front contact layer 710 includes an annealed transparent conductive oxide (TCO) layer. In some embodiments, the TCO layer is highly doped. For example, the charge carrier density of the TCO layer can be from about $1\times10^{17}$ $cm^{-3}$ to about $1\times10^{18}$ $cm^{-3}$. The TCO material for the annealed TCO layer can include any suitable front contact material, such as metal oxides and metal oxide precursors. In some embodiments, the TCO material can include zinc oxide (ZnO), cadmium oxide (CdO), indium oxide ($In_2O_3$), tin dioxide ($SnO_2$), tantalum pentoxide ($Ta_2O_5$), gallium indium oxide ($GaInO_3$), ($CdSb_2O_3$), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, $SnO_2$ can be doped with antimony (Sb), F, As, niobium (Nb), or tantalum (Ta). In other embodiments, $In_2O_3$ can be doped with tin (Sn), Mo, Ta, tungsten (W), Zr, F, Ge, Nb, Hf, or Mg. In other embodiments, CdO can be doped with In or Sn. In other embodiments, $GaInO_3$ can be doped with Sn or Ge. In other embodiments, $CdSb_2O_3$ can be doped with Y. In other embodiments, ITO can be doped with Sn. Other embodiments include still other TCO materials and corresponding dopants. In some embodiments, the front contact layer 710 is from about 5 nm to about 3 µm thick outside of the P2 scribe line, from about 0.5 nm to about 3 µm on side walls of the P2 scribe line, and from about 5 nm to about 3 µm on the bottom of the P2 scribe line (directly on the back contact layer).

A further aspect of the present disclosure is a CIGS absorber layer 706 produced by method 1000, which can be incorporated into a thin film solar cell 700. The thin film solar cell 700 comprises a bottom layer 412, a back contact layer 413, a CIGS absorber layer 706 produced by method 1000, a buffer layer 708, and a front contact layer 710.

The present disclosure thus provides a method of forming a CIGS absorber by solid sintering. This method has several advantages. First, the toxic solvents and solutions associated with the solutions-based method of CIGS absorber formation are avoided. The method of the present disclosure is thus significantly more user- or manufacturer-friendly. Second, the stacking and compression of powders and/or gels enables the creation of layered CIGS absorbers which, as a result of the compression, include transition zones unlike the any layered CIGS absorber produced by the solutions-based method.

In some embodiments, a method of forming a CIGS absorber comprises: preparing a first source particle as a first powder for application onto a substrate; applying the first powder onto the substrate; and annealing the first powder.

In some embodiments, a method of forming a CIGS absorber comprises: creating a plurality of powders for application to a substrate from each of a selected plurality of source particles; applying the plurality of powders to a first substrate; and annealing the plurality of powders.

In some embodiments, a gel stack comprises a $GaSe_x$ gel layer disposed above a back contact layer; a $CuSe_x$ gel layer disposed above said $GaSe_x$ layer; and a In $Se_x$ gel layer disposed above said $CuSe_x$ layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a CIGS absorber, comprising:
preparing a first source particle as a first powder for application onto a transfer substrate;
applying said first powder onto said transfer substrate, wherein said first powder is dry at a time of application to said transfer substrate;
compressing and annealing said first powder to form a first layer;
transferring said first layer to a solar cell substrate;
preparing a second source particle as a second powder for application onto the transfer substrate;
applying said second powder onto said transfer substrate, wherein said second powder is dry at a time of application to said transfer substrate;
compressing and annealing said second powder to form a second layer;
transferring said second layer to overlie the solar cell substrate such that said first layer is disposed between said second layer and said solar cell substrate; and
compressing said first layer and said second layer over the solar cell substrate.

2. The method of claim 1, wherein annealing said first powder comprises:
oxidizing said first powder;
reducing said first powder; and
selenizing said first powder.

3. The method of claim 2, wherein annealing said first powder further comprises:
sulfurizing said first powder.

4. The method of claim 1 wherein preparing said first source particle as a first powder comprises:
mixing said first source particle with a binder;
baking the mixture of said source particle and said binder; and
grinding the baked mixture to achieve a predetermined grain size.

5. A method of forming a CIGS absorber, comprising:
forming a plurality of powders for application to a substrate from each of a plurality of source particles;
applying said plurality of powders to a first substrate, wherein said plurality of powders are dry at a time of application to said substrate and wherein the applying comprises sequentially performing, for each of said plurality of powders:
depositing a layer of one of said plurality of powders on said first substrate;
compressing said layer to form a compressed layer;
removing said compressed layer from said first substrate;
applying each removed layer formed by each of a plurality of powders over a second substrate to form a layered powder stack;
compressing said layered powder stack to form a CIGS absorber layer; and annealing said CIGS absorber layer.

6. The method of claim 5, wherein said CIGS absorber layer is transferred to a thin film solar cell.

7. The method of claim 5, wherein annealing said CIGS absorber layer comprises:
oxidizing said CIGS absorber layer in an atmosphere with a temperature of 250 to 450° C.;
reducing said CIGS absorber layer in an atmosphere with a temperature of 200 to 550° C.; and
selenizing said CIGS absorber layer in an atmosphere with a temperature of 500 to 600° C.

8. The method of claim 7, further comprising:
sulfurizing said CIGS absorber layer in an atmosphere with a temperature of 500 to 600° C.

9. The method of claim 7, wherein forming the plurality of powders for application to the substrate from the plurality of source particles comprises:
creating a plurality of mixtures by mixing each of said plurality of source particles with a binder;
baking each of said plurality of mixtures; and
grinding each of the plurality of baked mixture to achieve a predetermined grain size.

10. The method of claim 5, said CIGS absorber layer comprising a layer comprising gallium and selenium, a layer comprising indium and selenium, and a layer comprising copper and selenium.

11. The method of claim 10 wherein said powder stack is compressed by roll bonding.

12. The method of claim 5 wherein forming each of said plurality of powders comprises for each of said plurality of powders:
mixing a source particle with a binder;
baking the mixture of said source particle and said binder; and
grinding the baked mixture to achieve a predetermined grain size.

13. A method of forming a CIGS stack comprising a layer comprising gallium and selenium, a layer comprising copper and selenium, and a layer comprising indium and selenium, the method comprising:
depositing individually a powder comprising gallium and selenium, a powder comprising copper and selenium, and a powder comprising indium and selenium respective transfer substrates;

compressing individually on the respective transfer substrates each of the powder comprising gallium and selenium, the powder comprising copper and selenium, and the powder comprising indium and selenium to form the layer comprising gallium and selenium, the layer comprising copper and selenium, and the layer comprising indium and selenium;

sequentially transferring to a substrate the layer comprising gallium and selenium, the layer comprising copper and selenium, and the layer comprising indium and selenium such that the layer comprising gallium and selenium is disposed on the substrate, the layer comprising copper and selenium is disposed on the layer comprising gallium and selenium, and the layer comprising indium and selenium is disposed on the layer comprising copper and selenium;

compressing collectively the substrate, the powder comprising gallium and selenium, the powder comprising copper and selenium, and the powder comprising indium and selenium to form a CIGS stack;

annealing the CIGS stack wherein the annealing step comprises oxidizing, reducing, and selenizing at least a portion of the CIGS stack.

14. The method of claim 13 wherein the oxidizing is performed in an atmosphere with a temperature of 250 to 450 ° C.

15. The method of claim 14 wherein the reducing is performed in an atmosphere with a temperature of 200 to 550 ° C.

16. The method of claim 15 wherein the selenizing is performed in an atmosphere with a temperature of 500 to 600 ° C.

17. The method of claim 16 wherein annealing the stack further comprises:

sulfurizing said plurality of powders in an atmosphere with a temperature of 500 to 600 ° C.

18. The method of claim 13 further comprising forming each of a powder comprising gallium and selenium, a powder comprising copper and selenium, and a powder comprising indium and selenium.

19. The method of claim 18 wherein forming each of said plurality of powders comprises for each of said plurality of powders:

mixing a source particle with a binder;

baking the mixture of said source particle and said binder; and grinding the baked mixture to achieve a predetermined grain size.

* * * * *